United States Patent
Pokharna et al.

(10) Patent No.: US 6,415,612 B1
(45) Date of Patent: Jul. 9, 2002

(54) METHOD AND APPARATUS FOR EXTERNAL COOLING AN ELECTRONIC COMPONENT OF A MOBILE HARDWARE PRODUCT, PARTICULARLY A NOTEBOOK COMPUTER, AT A DOCKING STATION HAVING A THERMOELECTRIC COOLER

(75) Inventors: Himanshu Pokharna, San Jose; Eric DiStefano, Livermore, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/894,135

(22) Filed: Jun. 29, 2001

(51) Int. Cl.[7] ................................. F25B 21/02
(52) U.S. Cl. .................. 62/3.2; 62/259.2; 165/80.2
(58) Field of Search .................. 62/3.2, 3.3, 3.62, 62/259.2; 361/700, 687; 165/80.2, 80.3

(56) References Cited

U.S. PATENT DOCUMENTS

| | | | |
|---|---|---|---|
| 5,513,070 A | * | 4/1996 | Xie et al. .................. 361/700 |
| 5,898,569 A | | 4/1999 | Bhatia |
| 5,959,836 A | * | 9/1999 | Bhatia .................. 361/687 |
| 5,974,556 A | | 10/1999 | Jackson et al. |
| 6,069,791 A | * | 5/2000 | Goto et al. .................. 361/687 |
| 6,094,347 A | * | 7/2000 | Bhatia .................. 361/695 |
| 6,109,039 A | * | 8/2000 | Hougham et al. ............ 62/3.7 |
| 6,172,871 B1 | * | 1/2001 | Holung et al. .............. 361/687 |
| 6,239,970 B1 | * | 5/2001 | Nakai et al. ................. 361/695 |
| 6,276,448 B1 | * | 8/2001 | Maruno ....................... 165/185 |

* cited by examiner

*Primary Examiner*—Denise L. Esquivel
*Assistant Examiner*—Melvin Jones
(74) *Attorney, Agent, or Firm*—Antonelli, Terry, Stout & Kraus, LLP

(57) ABSTRACT

A portable computer has enhanced cooling of its processor in a docked mode of operation. External cooling of the computer processor takes place using a thermoelectric cooler in the docking station which has its cold side engaged in heat conducting relation in a bottom mount configuration with a thermal port on the computer for transporting heat from the computer to a cooling mechanism in the docking station. The portable computer is a notebook computer operable in undocked and docked modes in an example embodiment.

29 Claims, 3 Drawing Sheets

METHOD AND APPARATUS FOR EXTERNAL COOLING AN ELECTRONIC COMPONENT OF A MOBILE HARDWARE PRODUCT, PARTICULARLY A NOTEBOOK COMPUTER, AT A DOCKING STATION HAVING A THERMOELECTRIC COOLER

TECHNICAL FIELD

The invention relates to a method and apparatus for external cooling of an electronic component of a hardware product which is mobile for use in an undocked mode and which is mountable on a docking station for use in a docked mode. The hardware product is a notebook computer and the electronic component is a processor of the computer in disclosed example embodiments.

BACKGROUND

The use of a docking station to provide additional cooling for the processor of a portable computer is, per se, known. See, for example, assignee's U.S. Pat. No. 5,974,556. With the increasing power levels and hot spot issues on the processors of notebook computers, the limit of cooling capability from within the notebook computers is in sight. When the internal cooling capability hits a limit, the burden of cooling will have to shift outside to a docking station to enable a notebook computer working at peak performance in docked mode (with cooling assistance from the dock) and at some reduced power level (so it is thermally manageable by the solution within the notebook computer) while undocked. One of the significant challenges in realizing cooling from a dock is the thermal resistance and other mechanical connection related issues between the notebook computer and the dock. There is a need for an improved method and apparatus to provide external cooling of a processor in a portable computer, particularly a notebook computer, during operation of the computer on a docking station. Such a solution would enable higher power processors to be used in notebook computers. The present invention addresses this need.

Various features and advantages of the present invention will become apparent from the following detailed description, when taken in connection with the accompanying drawings which show, for purposes of illustration only, two example embodiments in accordance with the present invention.

DETAILED DESCRIPTION

Figure 1:
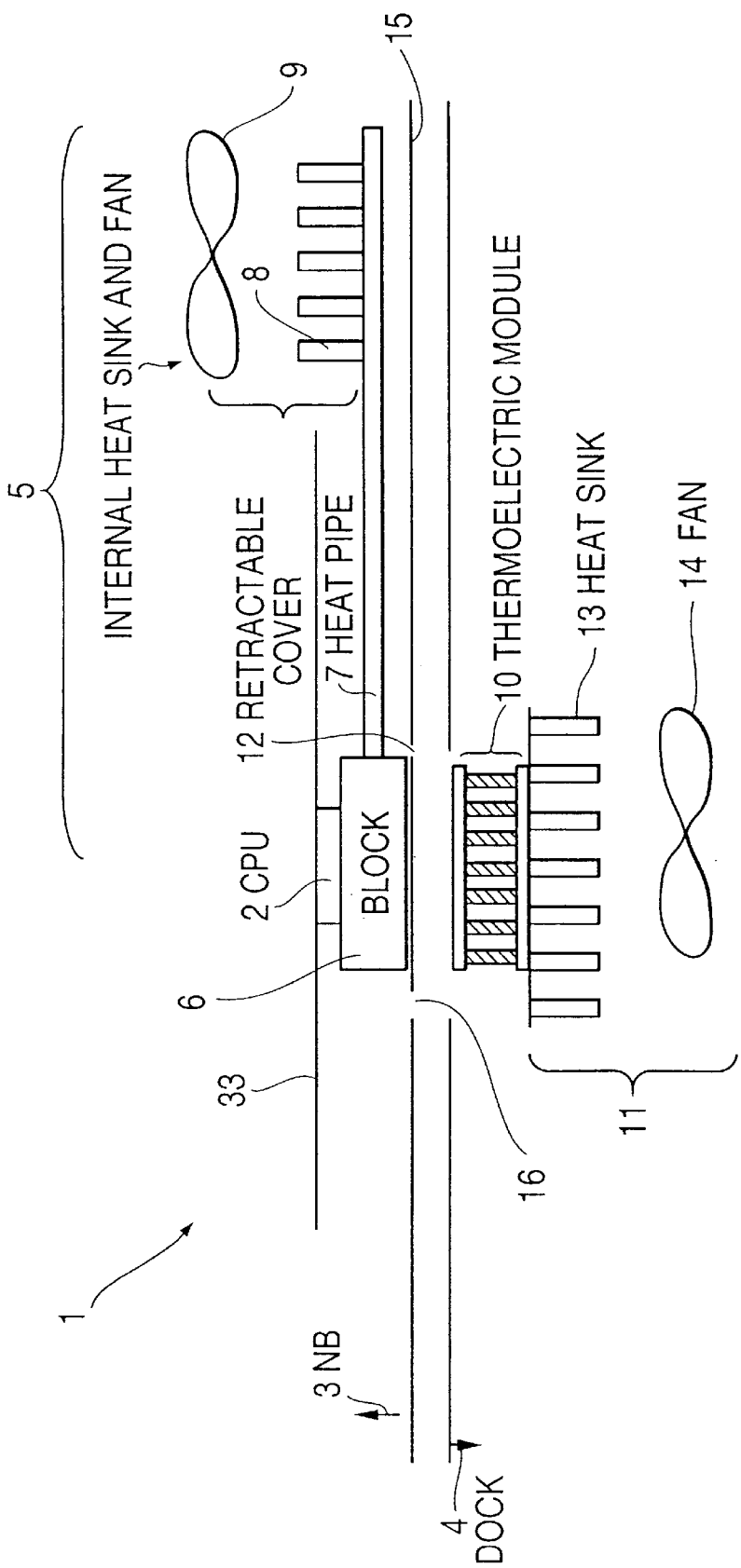
FIG. 1 is a schematic drawing of a first example embodiment of an apparatus of the invention for cooling the processor of a notebook computer in both a docked mode of operation and in an undocked mode of operation.

The three example embodiments illustrated in the drawings are each a notebook computer and a docking station for the notebook computer which enable substantially increased thermal capability of the notebook computer in the docked mode. However, the present invention is applicable to other hardware products having electronic devices therein to be cooled. An "electronic device" as used herein is a single integrated circuit (IC) component or a multiple IC component operating in tandem, or a power supply or other heat-producing component. Examples of an electronic device include, but are not limited or restricted to, a processor, micro-controller, and a chipset. "Hardware product" is broadly defined as any commercial or noncommercial goods having the electronic device. Examples of a hardware product include, but are not limited or restricted to, a portable computer (e.g., a laptop or notebook computer, hand-held computer, etc.), a wireless telephone, camcorder, still-camera, video cassette recorder, set-top cable box, a video game system and the like, or other mobile product useful in both docked and undocked modes.

Thus, in a more general sense, the present invention is directed to an apparatus for cooling comprising a hardware product containing an electronic component to be cooled, the hardware product being mobile for use in an undocked mode and being mountable on a docking station of the apparatus for use in a docked mode. A first cooling mechanism is located in the hardware product in heat conducting relation to the electronic component thereof to cool the electronic component in both the undocked and docked modes of use of the hardware product. The first cooling mechanism is in heat conducting relation with a surface of the hardware product which functions as a thermal port for external cooling of the product. A second cooling mechanism is located in the docking station for the hardware product to provide additional, external cooling of the electronic device in the docked mode of use of the hardware product. A thermoelectric module/cooler is located in the docking station and arranged in heat conducting relation between the first and second cooling mechanisms when the hardware product is mounted on the docking station to transport heat from the thermal port of the hardware product to the second cooling mechanism to provide additional cooling of the electronic component in the docked mode of use of the hardware product.

More specifically, with reference to the first example embodiment of the invention depicted in FIG. 1, the apparatus 1 comprises a notebook computer 3 with a central processor unit (CPU) 2 located in a bottom mount configuration with respect to a mother board 33, and a docking station 4 for the computer. The notebook computer 3 is mobile for use in an undocked mode and as well in the docked mode when mounted on the docking station.

The apparatus 1 further comprises a first cooling mechanism 5 located in the notebook computer in heat conducting relation to the CPU to cool the CPU in both the undocked and docked modes of use of the computer. The first cooling mechanism comprises a heat conducting block 6 attached to the CPU, a heat pipe 7 attached to the block, a first heat exchanger 8 which receives heat transferred by the heat pipe from the block, and a fan 9 to drive air flow in the direction of the heat exchanger in FIG. 1 to provide cooling. The bottom surface of the block 6 functions as a thermal port on the bottom of the notebook computer which engages the cold-side of the thermoelectric cooler or module 10 located in the docking station 4. The docking station 4 also includes a second cooling mechanism 11 to provide additional, external cooling of the CPU in the docked mode of the computer. The second cooling mechanism 11 includes a dock heat exchanger in the form of heat sink 13 and a dock fan 14 to drive air flow over the heat sink to provide cooling.

The bottom skin or housing 15 of the notebook computer is formed with an opening 16, which may be closed by a retractable cover 12 to expose the lower surface of the block to the cold side of the thermoelectric cooler at the docking station for heat conducting engagement therewith when the computer is mounted on the docking station. The thermoelectric cooler in the docking station is arranged in a bottom mount configuration with respect to the lower surface of the block 6 which functions as a thermal port of the computer. The CPU in turn is in a bottom mount configuration with respect to its mother board/supporting member 33 as noted above. Thermal resistance going to the thermal port is kept to a minimum in this arrangement by avoiding the need for a second heat pipe going to the thermal port.

During the undocked operation of the computer, there need be no power supply to the thermoelectric cooler in the docking station and the heat pipe 7 transports all the heat from the block attached to the CPU to the remote heat exchanger 8 within the computer where the fan 9 drives air flow over it to provide cooling. During the undocked operation of the notebook computer, this is the only means of heat dissipation. However, when the computer is placed on the docking station, then the cover 12 over opening 16 retracts and the upper, cold side of the thermoelectric cooler comes in contact with the lower surface of the block 6.

The lower, hot side of the thermoelectric module 10 in the docking station is engaged in heat conducting contact with the upper surface of the heat sink 13 for dissipating heat with the help of the air flow provided by dock fan 14. Thus, when the computer is docked, the processor of the computer can perform at peak thermal power and its thermal port, the lower surface of block 6, will transport the additional heat, i.e., the cooling load on the thermoelectric cooler is the difference of CPU power in docked mode and the CPU power in undocked mode.

The arrangement of the thermoelectric cooler/module in the docking station offers the advantage of enhanced cooling, in the docked mode, without increasing the thickness requirements for thermal solution inside he notebook computer. Further, to aid in minimizing the thickness and weight of the notebook computer, the power supply (not shown) for the thermoelectric cooler preferably resides in the docking station itself Another thermoelectric cooler/module can be provided in the docking station for transferring heat from the power supply to the second cooling mechanism 11 or another cooling mechanism therein.

Historically, many people have looked at thermoelectric modules/coolers and found them unsuitable for CPU cooling needs. One of the reasons for that was that at relatively high power levels the coefficient of performance of a thermoelectric cooler is relatively low. In fact, in most operations, the thermoelectric coolers consume more energy than the cooling load on them resulting in a coefficient of performance of less than 1. This is primarily due to high resistive $i^2r$ losses at high current operations of the thermoelectric cooler, which is necessary to have a large cooling load capability. This limitation is overcome with the present invention in that the cooling load on the thermoelectric cooler is only a part of the total load because the internal thermal solution also bears the remaining part of the load, which enables the use of a thermoelectric cooler with coefficients of performance characteristics which are preferably greater than one. Moreover, the cold side temperature of the thermoelectric module is preferably above ambient which results in a good coefficient of performance.

The thermoelectric cooler is used to compensate for the thermal resistance of the mechanical port at the docking station and this is preferably done with a relatively small temperature difference between the hot side and the cold side of the thermoelectric cooler. At a smaller temperature difference, the thermoelectric cooler tends to have a larger coefficient of performance because it has to fight the natural heat transfer from the hot side to the cold side which is acting in the direction opposite to that intended to be achieved. Thus, conduction heat transfer is proportional to the temperature difference and at a high enough temperature difference the performance of the thermoelectric cooler deteriorates significantly.

Another potential limitation of using thermoelectric coolers is that their use puts a bound on the minimum thermal resistance that the heat sink side of the thermoelectric cooler must have. However, this difficulty is overcome with the present invention in that the heat sink 13 and fan 14 of the second cooling mechanism 11 of the invention is located in the docking station where the special constraints are less severe than in the notebook computer itself allowing the use of a larger fan-heat exchanger combination for reduced heat sink resistance.

Figure 2:
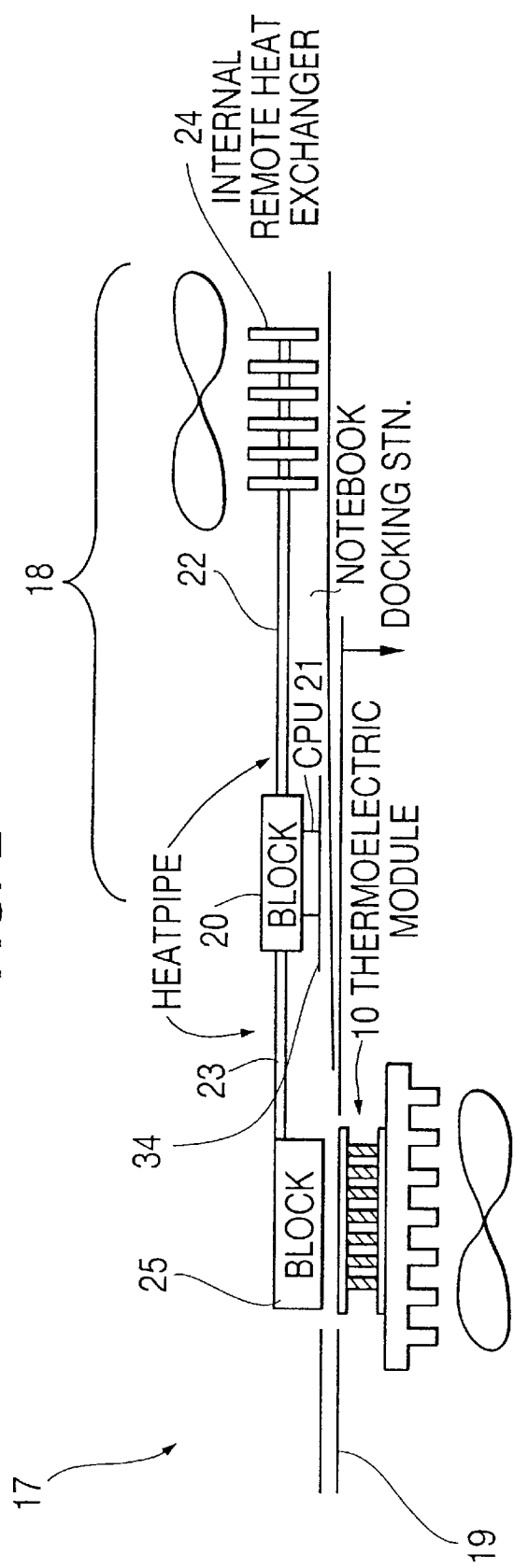
FIG. 2 is a schematic drawing of a second example embodiment according to the invention.

The apparatus 17 of the second example embodiment of the invention shown in FIG. 2 comprises a notebook computer with the CPU 21 on top of the motherboard 34 with a heat conducting block 20 on top of the CPU. Dual heat pipes 22 and 23 are provided on the block 20. One of the heat pipes, 22, terminates at a remote heat exchanger 24 in the notebook computer and the other heat pipe 23 terminates in a solid heat conducting block 25. The lower surface of the block 25 serves as a thermal port which comes in contact with the thermoelectric cooler 10 in the docking station for external cooling.

Figure 3:
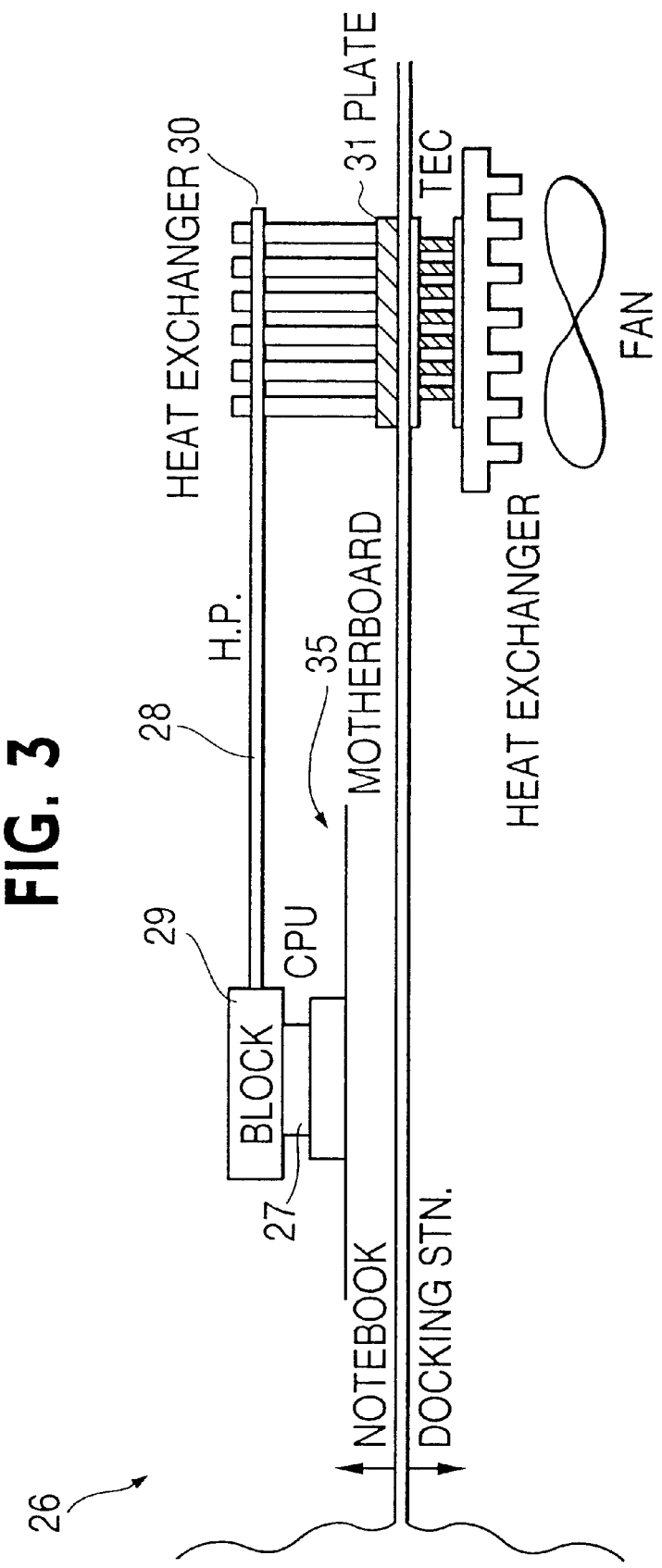
FIG. 3 is a schematic drawing of a third example embodiment according to the present invention.

The apparatus 26 of the third example embodiment, FIG. 3, has a CPU 27 with a single heat pipe 28 coming from the block 29 on top of the CPU. The CPU is on top of the motherboard 35. This terminates in a remote heat exchanger 30 in the computer. The remote heat exchanger 30 has a plate 31 on its lower surface that comes in contact with a thermoelectric cooler (TEC) in the docking station as in the embodiments of FIGS. 1 and 2. It is also possible in the embodiments of FIGS. 2 and 3 to have the CPU mounted on the bottom of the motherboard.

The thermoelectric module in the apparatus of the invention acts as a refrigerator pumping heat from the lower temperature heat exchanger (or more precisely the temperature on the thermoelectric cooler face in contact with the surface/thermal port of the heat exchanger) to the higher temperature heat sink/second cooling mechanism in the docking station.

The higher temperature heat sink/cooling mechanism can be a heat exchanger-fan combination similar to that in the apparatus 1 of FIG. 1 or other cooling mechanism wherein the heat is eventually dissipated to the ambient air.

Although this thermoelectric method of the invention requires that more heat be dissipated than just the processor power, the heat sink/cooling mechanism in the docking station can be much larger than the notebook computer and also the heat sink base to air temperature difference can be much higher. This permits lower noise levels for the accelerated performance in the docking station with the thermoelectric cooling approach even though it has to dissipate more power. The invention also enables higher power processors for use in notebook computers by encompassing part of the cooling burden inside the docking station in the manner described. It is also possible to selectively switch on the thermoelectric cooler only when the CPU starts to get hot (in the docked mode). This is useful for certain software applications where the load on the CPU is not high and the extra cooling not required.

While we have shown and described only three embodiments in accordance with the present invention, it is understood that the same is not limited thereto, but is susceptible to numerous changes and modifications as known to those skilled in the art. For example, while the thermal ports of the notebook computers of the example embodiments are located on the bottom of the computer, it is possible to have the thermal ports on the sides or the back side of the notebook computer. Another possible variation is the type of conductive port. Instead of a flat surface parallel to the notebook skin, it can be a slanted flat surface or many other shapes where two complimentary sides come in good thermal contact. Therefore, we do not wish to be limited to the details shown and described herein, but intend to cover all such changes and modifications as are encompassed by the scope of the appended claims.

We claim:

1. An apparatus for cooling comprising:

a hardware product containing an electronic component to be cooled, the hardware component being mobile for use in an undocked mode and being mountable on a docking station for use in a docked mode;

a docking station on which the hardware product can be mounted;

a first cooling mechanism located in the hardware product in heat conducting relation to the electronic component thereof to cool the electronic component in both the undocked and docked modes of use of the hardware product, the first cooling mechanism including a heat conducting first block attached to the electronic component, a first heat pipe attached to the first block, a first internal remote heat exchanger which receives heat transferred by the first heat pipe from the first block, and a fan to drive air flow over the first internal remote heat exchanger to provide cooling, and wherein the first cooling mechanism is in heat conducting relation with a surface of the hardware product which functions as a thermal port by way of at least the first block of the first cooling mechanism;

a second cooling mechanism located in the docking station to provide additional cooling of the electrical component in the docked mode of the use of the hardware product; and a thermoelectric cooler located in the docking station and arranged in heat conducting relation between the first and second cooling mechanisms when the hardware product is mounted on the docking station to transport heat from the thermal port of the hardware product to the second cooling mechanism to provide additional cooling of the electronic component in the docked mode of use of the hardware product.

2. The apparatus according to claim 1, wherein the thermal port is arranged on the bottom of the hardware product.

3. The apparatus according to claim 1, wherein the hardware product is a portable computer and the electronic component thereof is a processor.

4. The apparatus according to claim 1, wherein the mobile hardware product is a notebook computer.

5. The apparatus according to claim 1, wherein the surface of the hardware product which functions as a thermal port is a surface of the first block.

6. The apparatus according to claim 1, wherein the surface of the hardware product which functions as a thermal port is a surface of a plate attached to the first heat exchanger.

7. An apparatus for cooling comprising:

a hardware product containing an electronic component to be cooled, the hardware component being mobile for use in an undocked mode and being mountable on a docking station for use in a docked mode;

a docking station on which the hardware product can be mounted;

a first cooling mechanism located in the hardware product in heat conducting relation to the electronic component thereof to cool the electronic component in both the undocked and docked modes of use of the hardware product, the first cooling mechanism being in heat conducting relation with a surface of the hardware product which functions as a thermal port;

a second cooling mechanism located in the docking station to provide additional cooling of the electrical component in the docked mode of the use of the hardware product; and a thermoelectric cooler located in the docking station and arranged in heat conducting relation between the first and second cooling mechanisms when the hardware product is mounted on the docking station to transport heat from the thermal port of the hardware product to the second cooling mechanism to provide additional cooling of the electronic component in the docked mode of use of the hardware product, wherein the first cooling mechanism comprises a heat conducting first block attached to the electronic component, a first heat pipe attached to the first block, a first heat exchanger which receives heat transferred by the first heat pipe from the first block, and a fan to drive air flow over the first heat exchanger to provide cooling, and wherein the surface of the hardware product which functions as a thermal port is a surface of a second block, a second heat pipe extending between the first and second blocks for conducting heat from the first block to the thermal port.

8. An apparatus for cooling comprising:

a hardware product containing an electronic component to be cooled, the hardware component being mobile for use in an undocked mode and being mountable on a docking station for use in a docked mode;

a docking station on which the hardware product can be mounted;

a first cooling mechanism located in the hardware product in heat conducting relation to the electronic component thereof to cool the electronic component in both the undocked and docked modes of use of the hardware product, the first cooling mechanism being in heat conducting relation with a surface of the hardware product which functions as a thermal port;

a second cooling mechanism located in the docking station to provide additional cooling of the electrical component in the docked mode of the use of the hardware product; and a thermoelectric cooler located in the docking station and arranged in heat conducting relation between the first and second cooling mechanisms when the hardware product is mounted on the docking station to transport heat from the thermal port of the hardware product to the second cooling mechanism to provide additional cooling of the electronic component in the docked mode of use of the hardware product, wherein a plurality of thermoelectric coolers are arranged in the docking station conducting heat from respective locations to the second cooling mechanism when the hardware product is mounted on the docking station.

9. A hardware product which is mobile for use in an undocked mode and which is mountable on a docking station for use in a docked mode, the hardware product comprising an electronic component and a cooling arrangement to cool the electronic component, the cooling arrangement including a first cooling mechanism in the hardware product attached in heat conducting relation with the electronic component to cool the electronic component in both the undocked and docked modes of use of the hardware product, the first cooling mechanism including a first heat conducting block attached to the electronic component, a first heat pipe attached to the first block, a first internal remote heat exchanger which receives heat transferred by the first heat pipe from the first block, and a fan to drive air flow over the first internal remote heat exchanger to provide cooling, and wherein the first cooling mechanism is in heat conducting relation with a bottom thermal port of the hardware product by way of at least the first block of the first cooling mechanism, the thermal port engaging, when the hardware product is in the docked mode, in heat conducting relation with a heat sink in a docking station to provide additional cooling of the electronic component in the docked mode of use of the hardware product.

10. The hardware product according to claim 9, wherein the hardware product is a portable computer and the electronic component is a processor of the computer.

11. The hardware product according to claim 9, wherein the hardware product is a notebook computer.

12. The hardware product according to claim 9, wherein the thermal port is a bottom surface of the first block.

13. A hardware product which is mobile for use in an undocked mode and which is mountable on a docking station for use in a docked mode, the hardware product comprising an electronic component and a cooling arrangement to cool the electronic component, the cooling arrangement including a first cooling mechanism in the hardware product attached in heat conducting relation with the electronic component to cool the electronic component in both the undocked and docked modes of use of the hardware product, the first cooling mechanism being in heat conducting relation with a bottom thermal port of the hardware product that engages, when the hardware product is in the docked mode, in heat conducting relation with a heat sink in a docking station to provide additional cooling of the electronic component in the docked mode of use of the hardware product, wherein the first cooling mechanism comprises a first heat conducting block attached to the electronic component, a first heat pipe attached to the first block, a first heat exchanger which receives heat transferred by the first heat pipe from the first block, and a fan to drive air flow over the first heat exchanger to provide cooling, and wherein the thermal port is a surface of a second heat conducting block in the computer which receives heat transferred from the first block by way of a second heat pipe.

14. The hardware product according to claim 9, wherein the thermal port is a bottom surface of a plate attached to the first heat exchanger.

15. A method to provide external cooling of a portable computer, the method comprising:
conducting heat within the portable computer to a thermal port on the portable computer by way of an internal cooling mechanism in the portable computer, for external cooling of the portable computer, and
transferring heat from the thermal port on the computer to a cooling mechanism located in a docking station for the portable computer by way of a thermoelectric cooler located in the docking station.

16. The method according to claim 15, including engaging a cold side of the thermoelectric cooler in the docking station in heat-conducting relation with the thermal port of the computer.

17. The method according to claim 15, wherein the heat is conducted within the portable computer to the thermal port by way of a block of the internal cooling mechanism in the portable computer.

18. The method according to claim 15, wherein the heat is conducted within the portable computer to the thermal port by way of a heat exchanger of the internal cooling mechanism in the portable computer.

19. The method according to claim 18, wherein a surface of a plate attached to the heat exchanger serves as the thermal port.

20. The method according to claim 15, wherein a surface of a block of the internal cooling mechanism in the portable computer serves as the thermal port.

21. The method according to claim 15, including conducting heat from the internal cooling mechanism in the portable computer to a block whose surface serves as the thermal port by a heat pipe.

22. A portable computer which is mobile for use in an undocked mode and which is mountable on a docking station for use in a docked mode, the portable computer comprising a processor located in a bottom mount configuration with respect to a supporting member and a cooling arrangement to cool the processor, the cooling arrangement including a first cooling mechanism in the computer attached in heat conducting relation with the processor to cool the processor in both the undocked and docked modes of use of the computer, the first cooling mechanism having a surface on the bottom of the computer which functions as a thermal port that engages when the computer is in the docked mode, in heat conducting relation with the cold side of a thermoelectric cooler in the docking station to transport heat from the processor of the computer to a second cooling mechanism in the docking station to provide additional cooling of the processor in the docked mode of use of the computer, wherein the first cooling mechanism comprises a heat conducting block attached to the processor, a heat pipe attached to the block, a first heat exchanger which receives heat transferred by the heat pipe from the block, and a fan to drive air flow over the first heat exchanger to provide cooling, and wherein the surface of the first cooling mechanism which functions as the thermal port is a lower surface of the block.

23. A portable computer which is mobile for use in an undocked mode and which is mountable on a docking station for the use in a docked mode, the portable computer comprising a processor mounted on top of a supporting member and a cooling arrangement to cool the processor, the cooling arrangement including a first cooling mechanism in the computer attached in heat conducting relation with the processor to cool the processor in both the docked and undocked modes of use of the computer, the first cooling mechanism being in heat conducting relation with a surface of the computer which functions as a thermal port that engages, when the portable computer is in the docked mode, in heat conducting relation with the cold side of a thermoelectric cooler in the docking station to transport heat from the computer to a second cooling mechanism in the docking station to provide additional cooling of the processor in the docked mode of use of the computer, wherein the first cooling mechanism comprises a first heat conducting block attached to the top of the processor, a first heat pipe attached to the first block, a first internal remote heat exchanger which receives heat transferred by the first heat pipe from the first block, and a fan to drive air flow over the first heat exchanger to provide cooling, and wherein the surface of the first cooling mechanism which functions as the thermal port is a surface of a plate attached to the first internal remote heat exchanger.

24. A portable computer which is mobile for use in an undocked mode and which is mountable on a docking station for use in a docked mode, the portable computer comprising a processor mounted on top of a supporting member and a cooling arrangement to cool the processor, the cooling arrangement including a first cooling mechanism in the computer attached in heat conducting relation with the processor to cool the processor in both the docked and undocked modes of use of the computer, the first cooling mechanism being in heat conducting relation with a surface of the computer which functions as a thermal port that engages, when the portable computer is in the docked mode, in heat conducting relation with the cold side of a thermoelectric cooler in the docking station to transport heat from the computer to a second cooling mechanism in the docking station to provide additional cooling of the processor in the docked mode of use of the computer, wherein the first cooling mechanism comprises a first heat conducting block attached to the top of the processor, a heat pipe attached to the block, a first internal remote heat exchanger which receives heat transferred by the heat pipe from the block, and a fan to drive air flow over the first internal remote heat exchanger to provide cooling, and wherein the surface of the computer which functions as the thermal port is a surface of a second heat conducting block arranged in heat conducting relation with the first heat conducting block of the first cooling mechanism.

25. A portable computer which is mobile for use in an undocked mode and which is mountable on a docking station for the use in a docked mode, the portable computer comprising a processor mounted on top of a supporting member and a cooling arrangement to cool the processor, the cooling arrangement including a first cooling mechanism in the computer attached in heat conducting relation with the processor to cool the processor in both the docked and undocked modes of use of the computer, the first cooling mechanism being in heat conducting relation with a surface of the computer which functions as a thermal port that engages, when the portable computer is in the docked mode, in heat conducting relation with the cold side of the thermoelectric cooler in the docking station to transport heat from the computer to a second cooling mechanism in the docking station to provide additional cooling of the processor in the docked mode of use of the computer, wherein the first cooling mechanism comprises a heat conducting block attached to the top of the processor, a heat pipe attached to the block, a first heat exchanger which receives heat transferred by the heat pipe from the block, and a fan to drive air flow over the first heat exchanger to provide cooling, wherein the surface of the computer which functions as the thermal port is a surface of a second heat conducting block arranged in heat conducting relation with the first cooling mechanism, and wherein a second heat pipe is attached to the first block for conducting heat from the first block to the second block.

26. An apparatus to provide cooling of a processor in a portable computer during docked operation of the computer on a docking station, the apparatus comprising:

a first cooling mechanism located in the portable computer to conduct heat from the processor, the first cooling mechanism including a heat conducting block attached to the processor, a heat pipe attached to the block, an internal remote heat exchanger which receives heat transferred by the heat pipe from the block, and a fan to drive air flow over the internal remote heat exchanger to provide cooling, and wherein at least the block of the cooling mechanism is in heat conducting relation with a surface of the portable computer which functions as a thermal port, a second cooling mechanism located in the docking station to provide additional cooling of the processor during docked operation of the computer, and a thermoelectric cooler located in the docking station to transfer heat from the thermal port in the computer to the second cooling mechanism in the docking station when the computer is docked, a cold side of the thermoelectric cooler engaging in heat conducting relation the surface in the computer which functions as the thermal port.

27. The portable computer according to claim 23, wherein the surface of the plate which functions as a thermal port is a bottom surface.

28. The apparatus according to claim 26, wherein the cold side of the thermoelectric cooler engages the thermal port in the computer in a bottom mount configuration.

29. A portable computer which is mobile for use in an undocked mode and which is mountable on a docking station for use in a docked mode, the portable computer comprising a processor mounted on top of a supporting member and a cooling arrangement to cool the processor, the cooling arrangement including a first cooling mechanism in the computer attached in heat conducting relation with the processor to cool the processor in both the docked and undocked modes of use of the computer, the first cooling mechanism being in heat conducting relation with a surface of the computer which functions as a thermal port that engages, when the portable computer is in the docked mode, in heat conducting relation with the cold side of the thermoelectric cooler in the docking station to transport heat from the computer to a second cooling mechanism in the docking station to provide additional cooling of the processor in the docked mode of use of the computer, wherein the first cooling mechanism comprises a heat conducting block attached to the top of the processor, a heat pipe attached to the block, a first heat exchanger which receives heat transferred by the heat pipe from the block, and a fan to drive air flow over the first heat exchanger to provide cooling, wherein the surface of the computer which functions as the thermal port is a surface of a second heat conducting block arranged in heat conducting relation with the first cooling mechanism, and wherein the surface of the second heat conducting block which functions as a thermal port is a bottom surface.

* * * * *